US012805366B2

(12) United States Patent
Yaso et al.

(10) Patent No.: US 12,805,366 B2
(45) Date of Patent: Nov. 17, 2026

(54) ELECTRONIC COMPONENT AND METHOD FOR MANUFACTURING ELECTRONIC COMPONENT

(71) Applicant: Murata Manufacturing Co., Ltd., Kyoto (JP)

(72) Inventors: Toru Yaso, Kyoto (JP); Masahiro Teramoto, Kyoto (JP); Naoya Murakita, Kyoto (JP); Issei Yamamoto, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 817 days.

(21) Appl. No.: 18/064,968

(22) Filed: Dec. 13, 2022

(65) Prior Publication Data

US 2023/0113966 A1 Apr. 13, 2023

Related U.S. Application Data

(63) Continuation of application No. PCT/JP2021/022843, filed on Jun. 16, 2021.

(30) Foreign Application Priority Data

Jun. 17, 2020 (JP) ................................ 2020-104656

(51) Int. Cl.
*H10W 70/692* (2026.01)
*H05K 3/00* (2006.01)
(Continued)

(52) U.S. Cl.
CPC ........ *H10W 70/692* (2026.01); *H05K 3/0091* (2013.01); *H05K 3/12* (2013.01);
(Continued)

(58) Field of Classification Search
CPC ... H01L 23/15; H01L 23/13; H01L 23/49822; H01L 23/49894; H05K 3/0091;
(Continued)

(56) References Cited

U.S. PATENT DOCUMENTS

2007/0224400 A1 9/2007 Meguro et al.
2010/0301459 A1* 12/2010 Akiba .................... H01L 24/06 257/737
(Continued)

FOREIGN PATENT DOCUMENTS

JP S59-89489 A 5/1984
JP H08-181423 A 7/1996
(Continued)

OTHER PUBLICATIONS

International Search Report for PCT/JP2021/022843 dated Aug. 10, 2021.

*Primary Examiner* — Brigitte A Paterson
(74) *Attorney, Agent, or Firm* — McDonald Hopkins LLC

(57) ABSTRACT

An electronic component including: an electronic component body; at least one electrode on a surface of the electronic component body; and a cover layer having insulating properties on at least a part of a periphery of the electrode and extending across a boundary between the periphery of the electrode and the surface of the electronic component body, wherein the electrode includes, on the at least part of the periphery, a lower electrode closer to the surface of the electronic component body and an upper electrode on the lower electrode, the lower electrode extends more outward than the upper electrode to create a step at the at least part of the periphery of the electrode, and at the step at the periphery of the electrode, the cover layer extends from a surface of the upper electrode to a portion with no electrodes on the surface of the electronic component body.

17 Claims, 6 Drawing Sheets

(51) Int. Cl.

| | |
|---|---|
| ***H05K 3/12*** | (2006.01) |
| ***H05K 3/40*** | (2006.01) |
| ***H05K 3/46*** | (2006.01) |
| ***H10W 70/68*** | (2026.01) |
| ***H10W 70/685*** | (2026.01) |
| ***H10W 70/69*** | (2026.01) |

(52) U.S. Cl.
CPC ......... *H05K 3/4007* (2013.01); *H05K 3/4629* (2013.01); *H10W 70/68* (2026.01); *H10W 70/685* (2026.01); *H10W 70/69* (2026.01); *H05K 2203/0545* (2013.01)

(58) Field of Classification Search
CPC ...... H05K 3/12; H05K 3/4007; H05K 3/4629; H05K 2203/0545
See application file for complete search history.

(56) References Cited

U.S. PATENT DOCUMENTS

| | | | | |
|---|---|---|---|---|
| 2014/0057080 | A1 | 2/2014 | Wakoshi et al. | |
| 2014/0284790 | A1* | 9/2014 | Matsumoto | H01L 24/48 257/737 |
| 2015/0364410 | A1* | 12/2015 | Hando | H01R 43/205 174/126.1 |
| 2019/0069402 | A1 | 2/2019 | Takemori | |
| 2020/0006263 | A1* | 1/2020 | Seidemann | H01L 23/3157 |
| 2020/0273764 | A1* | 8/2020 | Chen | H01L 23/3192 |

FOREIGN PATENT DOCUMENTS

| | | | |
|---|---|---|---|
| JP | 2002-198637 | A | 7/2002 |
| JP | 4277275 | B2 | 6/2009 |
| JP | 2014-003124 | A | 1/2014 |
| JP | 2014-197606 | A | 10/2014 |
| JP | 5708798 | B2 | 4/2015 |
| JP | 5977180 | B2 | 8/2016 |
| WO | 2007/063692 | A1 | 6/2007 |
| WO | 2012/157436 | A1 | 11/2012 |
| WO | 2017/199712 | A1 | 11/2017 |

* cited by examiner

ELECTRONIC COMPONENT AND METHOD FOR MANUFACTURING ELECTRONIC COMPONENT

CROSS REFERENCE TO RELATED APPLICATION

This is a continuation of International Application No. PCT/JP2021/022843 filed on Jun. 16, 2021 which claims priority from Japanese Patent Application No. 2020-104656 filed on Jun. 17, 2020. The contents of these applications are incorporated herein by reference in their entireties.

BACKGROUND OF THE DISCLOSURE

Field of the Disclosure

The present disclosure relates to an electronic component and a method of producing an electronic component.

Description of the Related Art

One of known examples of electronic components is an electronic component having a structure including an electronic component body including a stack of multiple ceramic layers and electrodes on a surface of the electronic component body.

For example, Patent Literature 1 discloses a ceramic multilayer substrate having a structure in which a terminal electrode is a bilayer including an underlayer and an upper layer which sandwich an insulating layer therebetween.

Patent Literature 2 also discloses a ceramic electronic component having a structure in which at least part of a periphery of a terminal electrode is covered with an insulating layer.

Patent Literature

Patent Literature 1: JP 4277275 B
Patent Literature 2: JP 5708798 B

BRIEF SUMMARY OF THE DISCLOSURE

In the electronic component disclosed in Patent Literature 1, a portion of the underlayer is covered with the insulating layer. Here, when the electrode is small, the area of the electrode covered with an insulating layer is small, so that the adhesion between the insulating layer and the electrode is weak. Thus, separation occurs at the outer periphery of the upper layer on the insulating layer.

In the electronic component disclosed in Patent Literature 2, the thickness of the insulating layer on the electrode varies. In such a case, the rigidity of the insulating layer varies, making stress distribution uneven. Thus, the adhesion of the electrode is unstable.

The present disclosure was made to solve the above issues and aims to provide an electronic component in which electrode separation can be prevented by covering a periphery of an electrode with a cover layer having insulating properties.

The electronic component of the present disclosure includes: an electronic component body; at least one electrode on a surface of the electronic component body; and a cover layer having insulating properties on at least a part of a periphery of the electrode and extending across a boundary between the periphery of the electrode and the surface of the electronic component body, wherein the electrode includes, on the at least part of the periphery, a lower electrode closer to the surface of the electronic component body and an upper electrode on the lower electrode, the lower electrode extends more outward than the upper electrode to create a step at the at least part of the periphery of the electrode, and at the step at the periphery of the electrode, the cover layer extends from a surface of the upper electrode to a portion with no electrodes on the surface of the electronic component body.

The method of producing an electronic component of the present disclosure includes: forming a lower electrode and an upper electrode on a ceramic green sheet such that the lower and upper electrodes are overlaid on each other with different patterns so as to provide a step at at least a part of a periphery of a predetermined electrode; and printing a ceramic paste on the step by screen printing such that the ceramic paste covers from a surface of the upper electrode to a surface of a portion with no electrodes on the ceramic green sheet.

The present disclosure provides an electronic component in which electrode separation can be prevented by covering a periphery of an electrode with a cover layer having insulating properties.

DETAILED DESCRIPTION OF THE DISCLOSURE

The electronic component of the present disclosure is described below.

The present disclosure is not limited to the following preferred embodiments and may be suitably modified without departing from the gist of the present disclosure.

Combinations of two or more preferred features described in the following preferred embodiments are also within the scope of the present disclosure.

Figure 1:
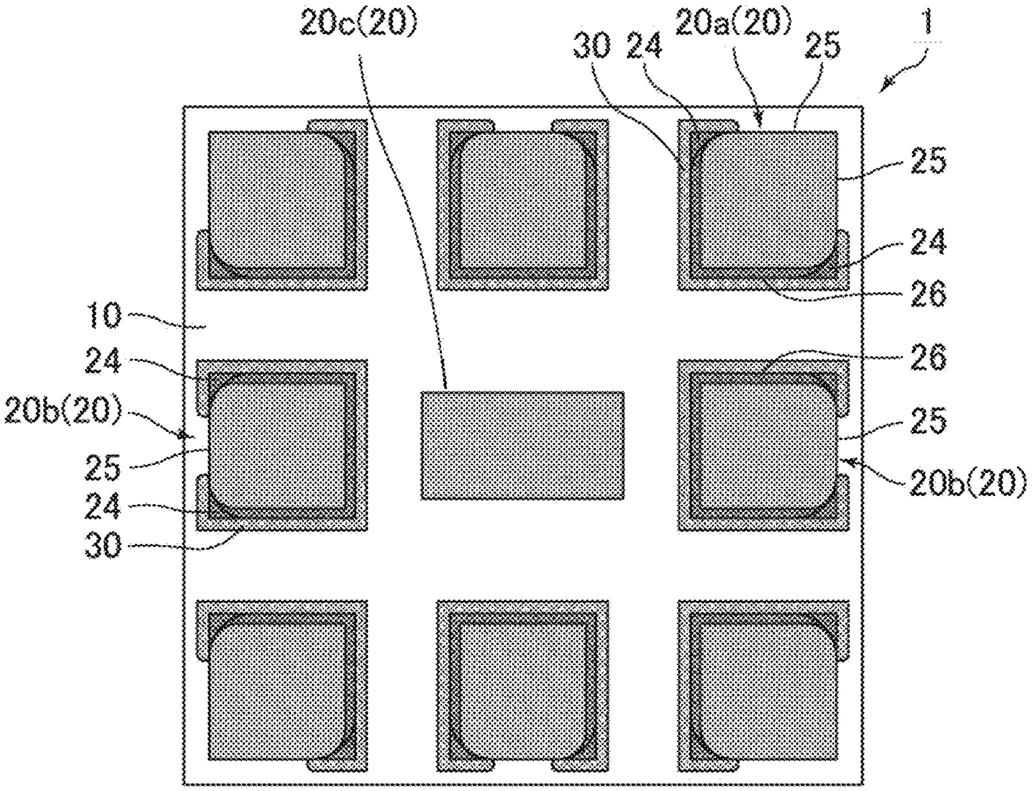
FIG. 1 is a schematic plan view of an example electronic component of the present disclosure.

FIG. 1 is a schematic plan view of an example electronic component of the present disclosure.

FIG. 1 shows a mounting surface. It is a surface having electrodes thereon for allowing mounting of an electronic component on a substrate or a mother board. Hereinafter, plan views of the electronic component each shows the mounting surface.

The electronic component may be a chip component, for example.

Examples of the chip component include multilayer ceramic electronic components such as LC composite components (e.g., multilayer filters), multilayer ceramic capacitors, and multilayer inductors. Examples of the chip component also include various ceramic electronic components other than the multilayer ceramic electronic components.

The chip component may be a ceramic component including a low temperature co-fired ceramic (LTCC) material.

The low temperature co-fired ceramic material is a ceramic material that can be sintered at a temperature of 1000° C. or lower and that can be co-fired with low resistive Au, Ag, Cu, or the like. Specific examples of the low temperature co-fired ceramic material include glass composite-based low-temperature co-fired ceramic materials in which a ceramic material such as alumina, zirconia, magnesia, or forsterite is mixed with borosilicate glass; crystallized glass-based low-temperature co-fired ceramic materials containing $ZnO—MgO—Al_2O_3—SiO_2$-based crystallized glass; and non-glass low-temperature co-fired ceramic material containing a $BaO—Al_2O_3—SiO_2$-based ceramic material or a $Al_2O_3—CaO—SiO_2—MgO—B_2O_3$-based ceramic material.

The electronic component of the present disclosure is not limited to a chip component and may be a substrate such as a multilayer ceramic substrate. When the electronic component is a multilayer ceramic substrate, the above-described low temperature co-fired ceramic (LTCC) material can be used as a ceramic material of the multilayer ceramic substrate.

An electronic component 1 shown in FIG. 1 includes an electrode 20 on a surface, i.e., a mounting surface, of an electronic component body 10. Multiple electrodes 20 are on the surface of the electronic component body 10.

FIG. 1 shows three types of electrodes as the multiple electrodes on the surface of the electronic component body 10.

The first type electrodes, which define outermost peripheral electrodes most peripherally disposed on the surface of the electronic component body 10, are corner electrodes 20*a* at respective four vertices of the quadrilateral mounting surface.

The second type electrodes, which also define outermost peripheral electrodes most peripherally disposed on the surface of the electronic component body 10, are edge electrodes 20*b* at respective edges of the quadrilateral mounting surface.

The third type electrode, which defines an electrode disposed inward on the surface of the electronic component body 10, is an inner electrode 20*c*.

Here, the shape of the surface of the electronic component body is a quadrilateral, but the shape of the electronic component body is not limited to a quadrilateral and may be another polygon.

Also in the case of another polygon, electrodes at vertices of the polygon can be defined as the corner electrodes, and electrodes at edges of the polygon can be defined as the edge electrodes.

The figure shows only one inner electrode, but there may be multiple inner electrodes. The inner electrode is an electrode located inward than the outermost peripheral electrodes on the surface of the electronic component body.

Herein, the outermost peripheral electrodes most peripherally disposed on the surface of the electronic component body are determined by the relative positional relationship between the electrodes. Electrodes most peripherally disposed (i.e., the electrodes with no other electrodes disposed externally therearound) among all the electrodes on the surface of the electronic component body are defined as the outermost peripheral electrodes.

The features of the electrodes in the electronic component of the present disclosure are described below with reference to the drawings, taking a corner electrode on an upper right vertex in FIG. 1 as an example.

Figure 2:
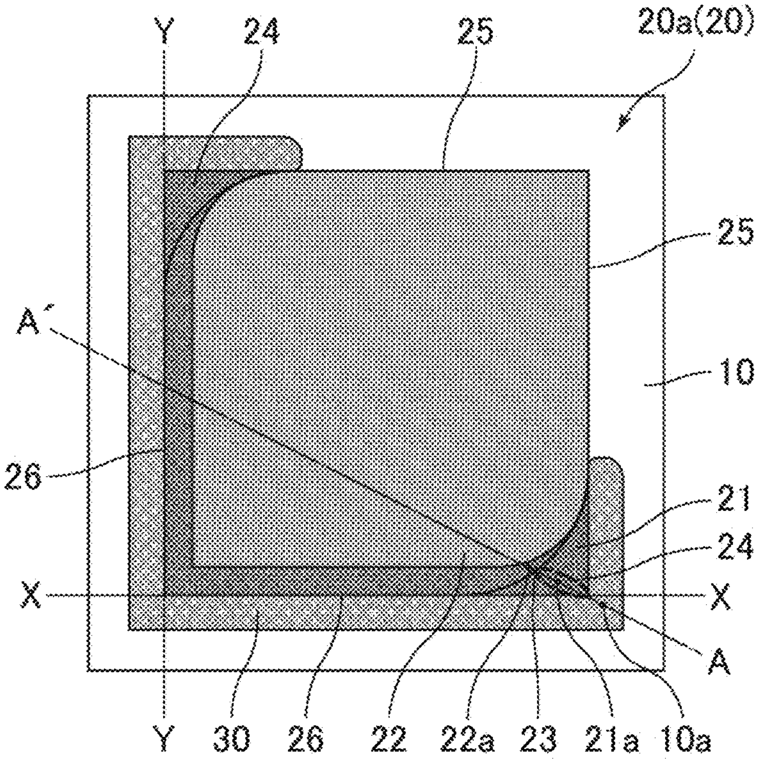
FIG. 2 is a schematic plan view of an example electrode and an example cover layer.

FIG. 2 is a schematic plan view of an example electrode and an example cover layer.

Figure 3:
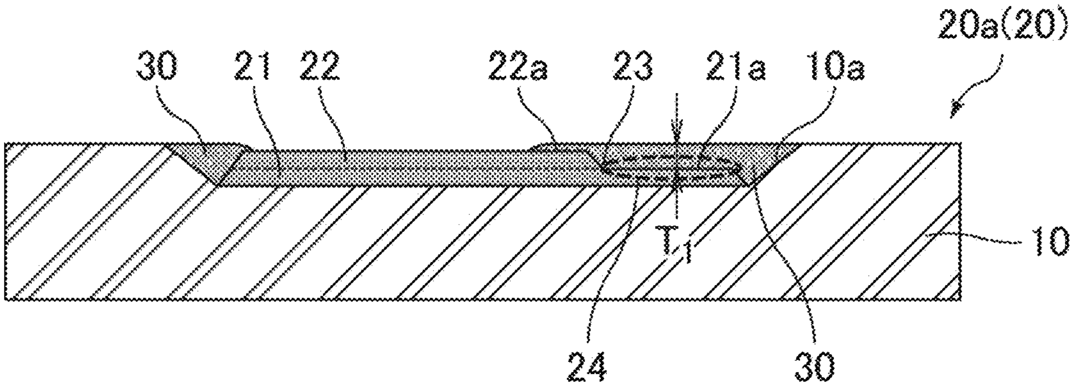
FIG. 3 is a cross-sectional view taken along line A'-A of the electrode and the cover layer shown in FIG. 2.

FIG. 3 is a cross-sectional view taken along line A'-A of the electrode and the cover layer shown in FIG. 2.

Figure 4:
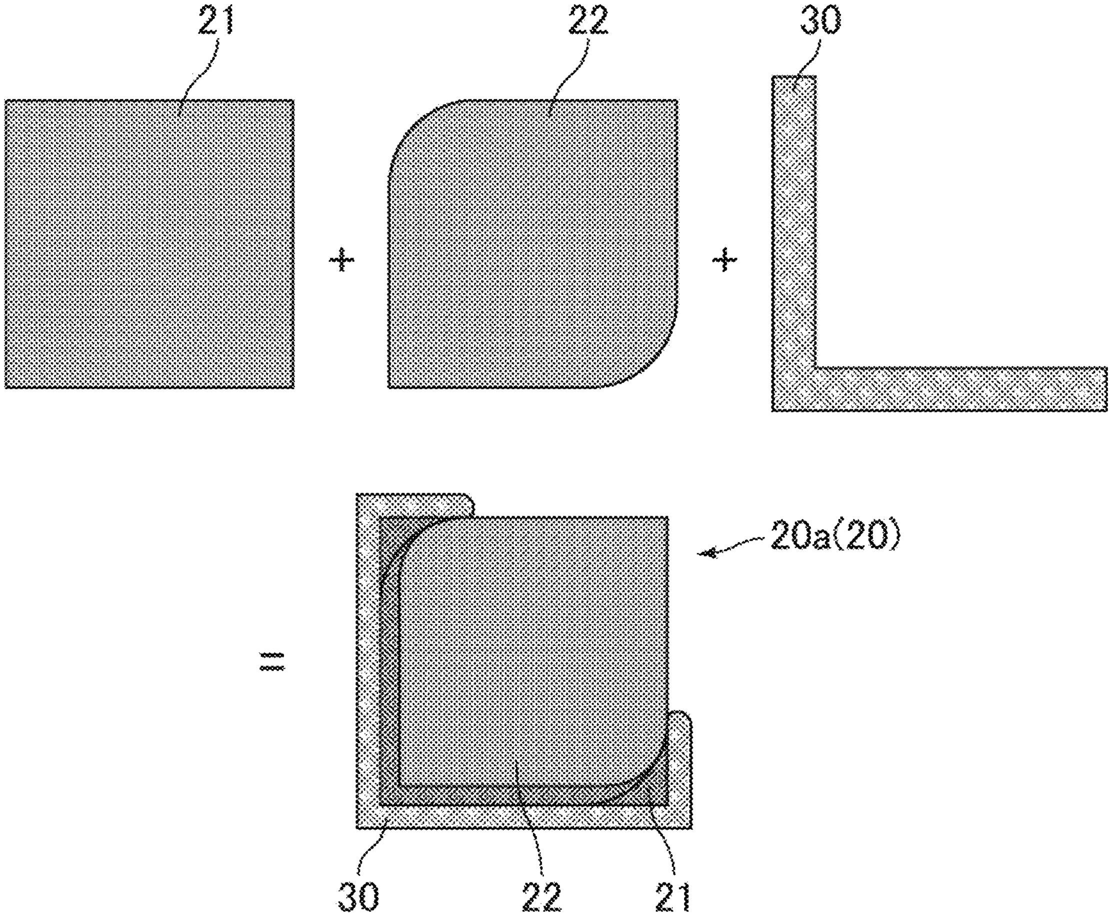
FIG. 4 is an exploded view of structures of the electrode and the cover layer shown in FIG. 2 and FIG. 3.

FIG. 4 is an exploded view of structures of the electrode and the cover layer shown in FIG. 2 and FIG. 3.

FIG. 2, FIG. 3, and FIG. 4 each show the corner electrode 20*a* and a cover layer 30 on the corner electrode 20*a*.

FIG. 4 shows the structures of the corner electrode 20*a* and the cover layer 30 shown in FIG. 2 and FIG. 3. FIG. 4 shows a stack of a lower electrode 21 having a substantially square top-view shape, an upper electrode 22 having a substantially square top-view shape similar to the lower electrode 21 and having a rounded upper left vertex and a rounded lower right vertex, and the cover layer 30 having a substantially L-shape.

When the electrode 20 and a ceramic paste that turns into the cover layer 30 are stacked and compression bonded, part of the ceramic paste flows, which deforms the shape of the cover layer 30 having a substantially L-shape. In the figure showing the stack of the corner electrode 20*a* and the cover layer 30, the shape of the cover layer has been deformed as a result of flowing of part of the ceramic paste.

As shown in the right side (at A of line A'-A in FIG. 2) of FIG. 3, the corner electrode 20*a* includes the lower electrode 21 and the upper electrode 22. The lower electrode 21 is an electrode closer to the surface of the electronic component body 10, and the upper electrode 22 is an electrode on the lower electrode 21.

In the right region of FIG. 3, on at least part of the periphery of the corner electrode 20*a*, the lower electrode 21 extends more outward than the upper electrode 22. This results in a step 24 at the periphery of the corner electrode 20*a*.

The step 24 refers to a region from a portion where the lower electrode 21 extends more outward than the upper electrode 22 (a surface 21*a* of the lower electrode) to a boundary 23 between the lower electrode 21 and the upper electrode 22.

In the left side (at A' of line A'-A in FIG. 2) of FIG. 3, the periphery of the lower electrode 21 is overlaid on the periphery of the upper electrode 22, and the corner electrode 20*a* includes no steps at its periphery.

The top-view shape of the corner electrode 20*a* is substantially square. The step 24 is near a vertex of the square (near lower right and upper left vertices). Specifically, there are two steps, one at a vertex (lower right vertex) where the step is formed as described in FIG. 3, and one at a vertex (upper left vertex) not adjacent to the lower right vertex in FIG. 2. There are no steps at the other two vertices.

The electrodes that can be used include those obtained by forming a pattern by a technique such as screen printing or photolithography using a conductive paste.

The conductive paste contains, for example, a conductive metal powder, a binder, and a plasticizer. A co-base material (ceramic powder) for adjusting the shrinkage rate may be added to the conductive paste. Examples of conductive metal materials contained in the conductive paste include metals containing at least one of Ag, a Ag—Pt alloy, a Ag—Pd alloy, Cu, Ni, Pt, Pd, W, Mo, and Au as a main component. Among these conductive metal materials, Ag, a Ag—Pt alloy, a Ag—Pd alloy, and Cu are more preferably used particularly for conductive patterns for high frequency applications because these materials have low resistivity.

The lower electrode and the upper electrode may be made of the same material or different materials, but the same material may be used for the same shrinkage rate. When the same material is used, there may be a case where the boundary between the lower electrode and the upper electrode cannot be recognized at a portion where the lower electrode and the upper electrode are overlaid on each other.

The electrode thickness may be, for example, 10 μm or more and 30 μm or less. The term "electrode thickness" as used herein refers to the total thickness of the electrodes including the lower electrode and the upper electrode.

The lower electrode thickness and the upper electrode thickness may each be 5 μm or more and 15 μm or less.

In the electronic component of the present disclosure, the electrodes with the cover layer thereon may be laid in the electronic component body.

When the electrodes with the cover layer thereon are laid in the electronic component body, the surface of the electrode (the surface of the upper electrode) is lower than the surface of the electronic component body as shown in FIG. 3.

When the electrodes with the cover layer thereon are laid in the electronic component body, the electrodes are less likely to directly contact another object even when the electronic component body is subjected to drop impact or handling impact during production, so that electrode separation from the surface of the electronic component body is more reliably prevented.

The electronic component of the present disclosure produced by a method of producing an electronic component (described later) has a cross-sectional shape as shown in FIG. 3 from compression bonding and firing.

As shown in FIG. 2, the cover layer 30 extends across boundaries between the periphery of the corner electrode 20*a* and the surface of the electronic component body. FIG. 2 indicates the boundaries between the periphery of the corner electrode 20*a* and the surface of the electronic component body 10 by an X-X line and a Y-Y line.

As shown in FIG. 2 and FIG. 3, the cover layer 30 extends on the step 24 from a surface 22*a* of the upper electrode to a portion 10*a* with no electrodes on the surface of the electronic component body.

The cover layer 30 is formed on a region including two edges of the corner electrode 20*a* having a square top-view shape and two steps 24.

The cover layer is a layer made of an insulating material. For example, a ceramic cover layer is used. The ceramic cover layer can be a ceramic cover layer containing the low temperature co-fired ceramic material. Alternatively, a raw material powder mixture obtained by adding an appropriate amount of alumina ($Al_2O_3$) powder to the low temperature co-fired ceramic material and mixing these components is dispersed in an organic vehicle and kneaded therein to produce a ceramic paste for forming ceramic cover layers, and the ceramic paste is applied and dried to produce a ceramic cover layer. Such a ceramic cover layer can also be used.

The effect achieved by the steps at the periphery of the electrode and the cover layer on each step is as follows.

In FIG. 3, the right side shows an example site including the step with the cover layer thereon, and the left side shows an example site including the cover layer without the step.

The cover layer thickness on the step is indicated by a double-headed arrow $T_1$. When the steps are disposed with the cover layer thereon, the cover layer includes a portion having a constant thickness indicated by the double-headed arrow $T_1$. Specifically, a portion where the cover layer thickness is constant extends in a predetermined range. When the cover layer has a thickness indicated by the double-headed arrow $T_1$, i.e., when the cover layer has a thickness substantially the same as the thickness of the upper electrode, the cover layer can have a higher rigidity. Thus, the rigidity of the cover layer can be improved by forming the cover layer on each step.

The cover layer thickness on the step (the thickness indicated by the double-headed arrow $T_1$) may be 1 μm or more and 20 μm or less.

For comparison, in the case of the site including the cover layer without the step as shown on the left side of FIG. 3, the cover layer thickness in this site decreases at a certain rate from the bottom toward the top, so that there is no portion where the cover layer thickness is constant. Thus, the cover layer has a lower rigidity, compared to the site where the cover layer is on the step.

Improved rigidity of the cover layer can increase the adhesion between the cover layer and the electrode. Thus, the effect of cover layer formation for preventing electrode separation by covering the periphery of the electrode with the cover layer can be more suitably exerted.

Improved rigidity of the cover layer also improves the resistance to abrasion and impact. The electronic component may be subjected to drop impact or handling impact during production, but the cover layer having a high rigidity is prevented from being separated or cracked, preventing the electrode from being exposed from the cover layer. This can stabilize the electrode shape including the cover layer, improving the yield of electrode dimensions.

A conductive film may be on the upper electrode. The conductive film serves as a site for mounting the electronic component on another substrate, mother board, or the like.

Figure 5:
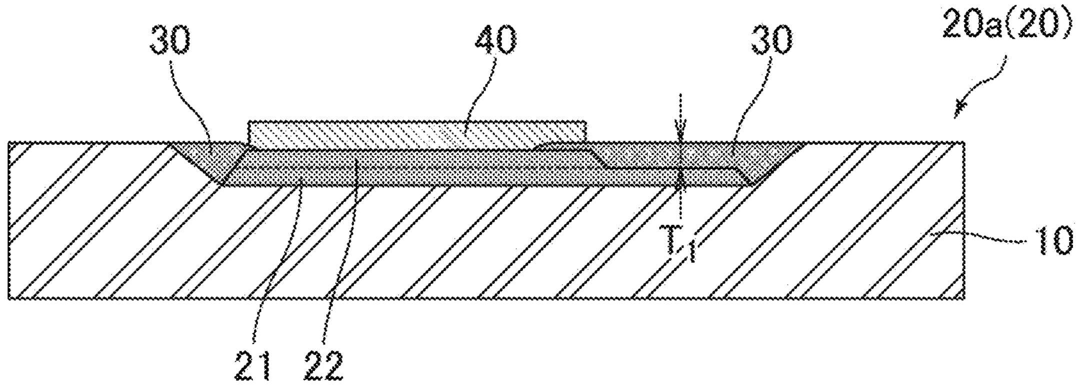
FIG. 5 is a schematic cross-sectional view of an embodiment including a conductive film on an upper electrode.

FIG. 5 is a schematic cross-sectional view of an embodiment including the conductive film on the upper electrode.

A conductive film 40 is on the upper electrode 22. The cover layer 30 does not cover the conductive film 40. The conductive film 40 covers the cover layer 30 on the surface of the upper electrode 22. Such an embodiment is achieved because the conductive films are formed after the electrodes and the cover layer are formed and fired in the process of electronic component production.

The conductive films are conductive layers formed by electroplating or electroless plating and are yet to be fired.

The features of the electrodes in the electronic component of the present disclosure have been described thus far, taking the corner electrodes among the electrodes shown in FIG. 1 as examples. Yet, the edge electrodes may have the features of the electrodes of the electronic component of the present disclosure.

Figure 6:
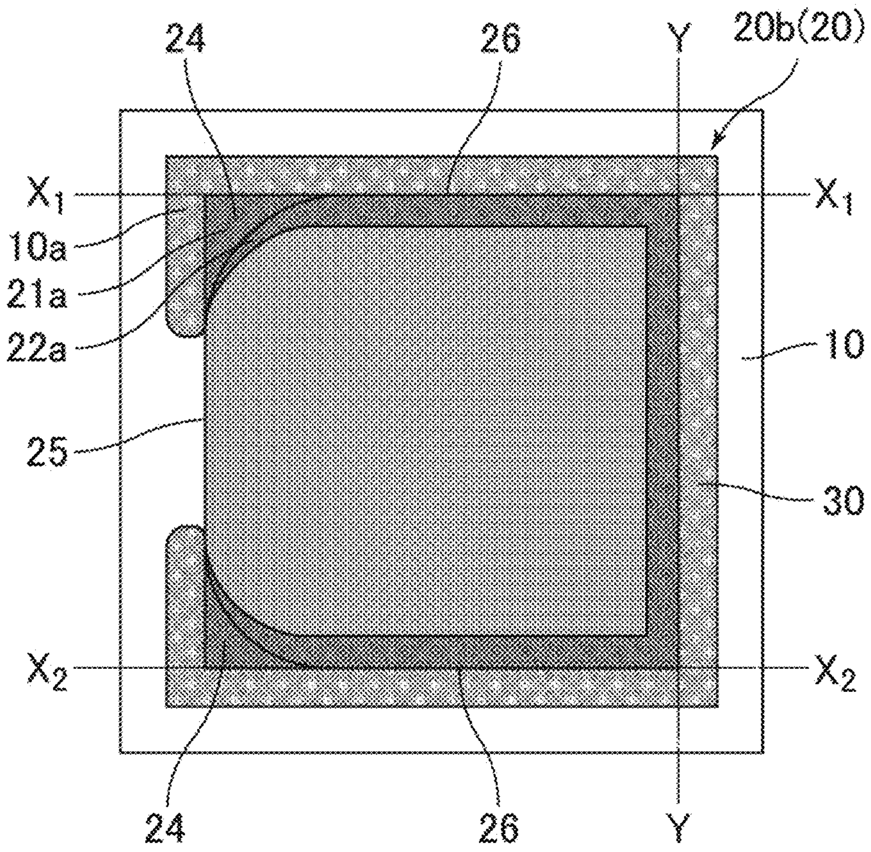
FIG. 6 is a schematic plan view of another example electrode and another example cover layer.

FIG. 6 is a schematic plan view of another example electrode and another example cover layer.

FIG. 6 shows the edge electrode 20*b* and the cover layer 30. The edge electrode 20*b* shown in FIG. 6 is an electrode at the center on the left side of FIG. 1. The cover layer 30 extends across boundaries between a periphery of the edge electrode 20*b* and the surface of the electronic component body 10. FIG. 6 indicates the boundaries between the periphery of the edge electrode 20*b* and the surface of the electronic component body 10 by an $X_1$-$X_1$ line, an $X_2$-$X_2$ line, and a Y-Y line.

The steps 24 are near an upper left vertex and a lower left vertex of the electrode having a substantially square shape. On each step 24, the cover layer 30 extends from the surface 22*a* of the upper electrode to the portion 10*a* with no electrodes on the surface of the electronic component body.

Also in the case of such an edge electrode, the effect achieved by the steps at the periphery of the electrode and the cover layer on each step is exerted, as is the case with the corner electrode.

The steps are most peripherally disposed on the surface of the electronic component body. Such a peripheral site is susceptible to separation due to drop impact or handling impact during production. Thus, when the electrode at the site includes the steps at its periphery and the cover layer is on each step, the effect of increasing the resistance to drop impact or handling impact during production is exerted.

There may be other embodiments of the electrodes each including the step at its periphery with the cover layer on the step.

In the electronic component of the present disclosure, the step may extend along the entire periphery of the electrode, and the cover layer may extend across all the boundaries between the periphery of the electrode and the electronic component body.

Figure 7:
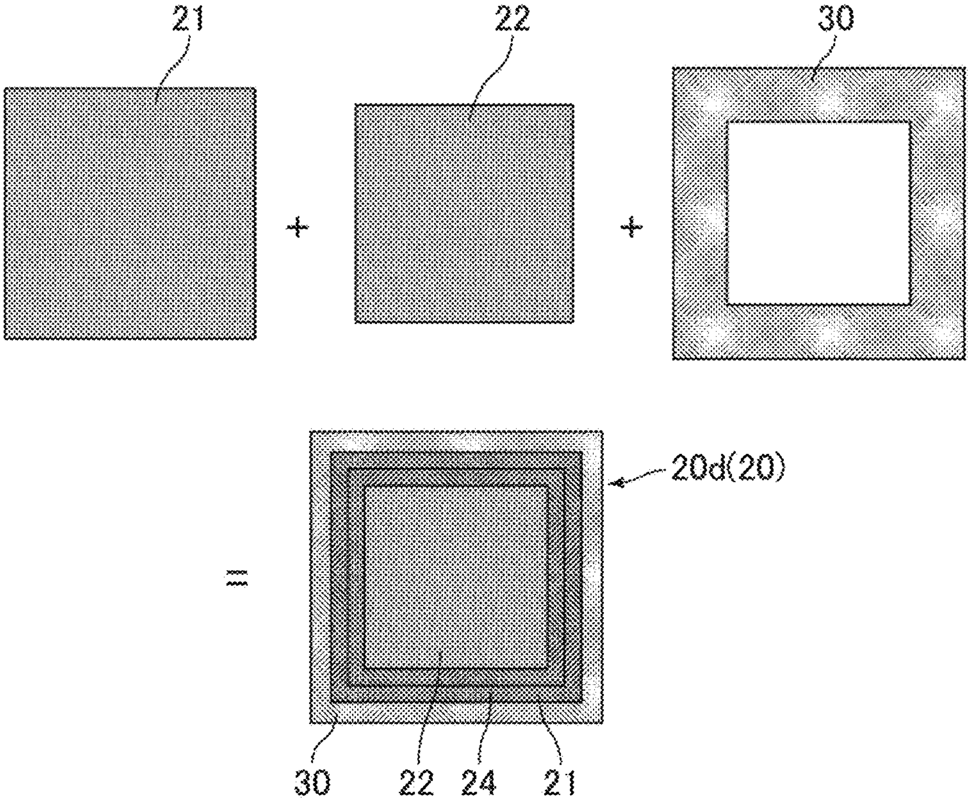
FIG. 7 is a schematic exploded view of a structure of another example electrode and another example cover layer.

FIG. 7 is a schematic exploded view of a structure of another example electrode and another example cover layer. Similarly to FIG. 4, FIG. 7 shows structures of the lower electrode 21, the upper electrode 22, and the cover layer 30.

An electrode 20*d* shown in FIG. 7 includes a stack of the lower electrode 21 having a substantially square top-view shape and the upper electrode 22 having a substantially square shape smaller than the lower electrode 21. The step 24 extends along the entire periphery of the electrode 20*d*. The cover layer 30 extends across all the boundaries between the periphery of the electrode 20*d* and the electronic component body. The cover layer 30 covers the entirety of the step 24.

With such an embodiment, the effect achieved by the step at the periphery of the electrode and the cover layer on the step is exerted across the entire periphery of the electrode.

In the electronic component of the present disclosure, the steps may be near all the vertices of the periphery of the electrode, and the cover layer may extend across all the boundaries between the periphery of the electrode and the electronic component body.

Figure 8:
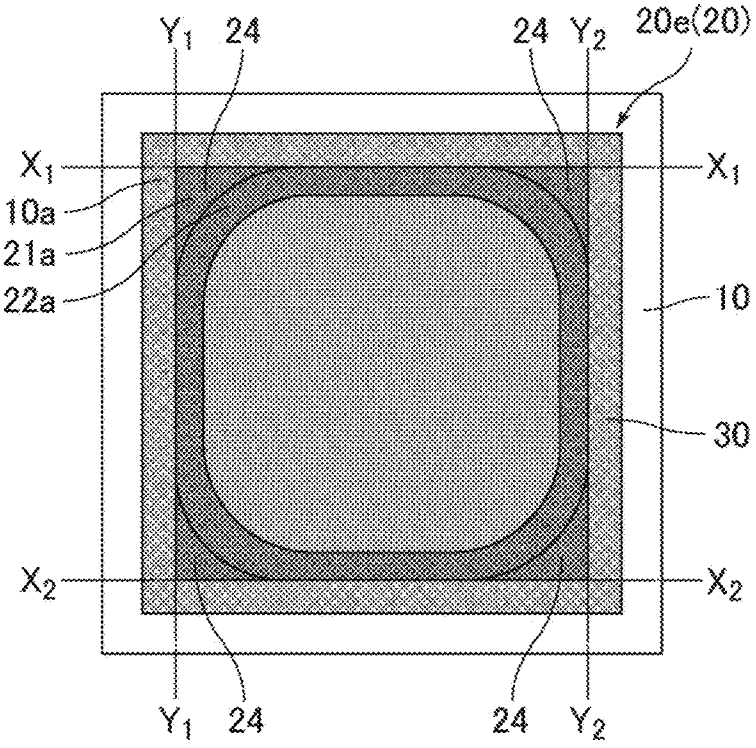
FIG. 8 is a schematic plan view of another example electrode and another example cover layer.

FIG. 8 is a schematic plan view of another example electrode and another example cover layer.

FIG. 8 shows an electrode 20*e* and the cover layer 30. The cover layer 30 extends across boundaries between a periphery of the electrode 20*e* and the surface of the electronic component body 10. FIG. 8 indicates the boundaries between the periphery of the electrode 20*e* and the surface of the electronic component body 10 by an $X_1$-$X_1$ line, an $X_2$-$X_2$ line, a $Y_1$-$Y_1$ line, and a $Y_2$-$Y_2$ line.

In the electrode 20*e* shown in FIG. 8, the steps 24 are near respective four vertices of the electrode having a substantially square shape. On each step 24, the cover layer 30 extends from the surface 22*a* of the upper electrode to the portion 10*a* with no electrodes on the surface of the electronic component body.

The electrode is most weak and susceptible to separation at a portion near its vertex in the plan view, so that forming the cover layer near the vertex is effective in terms of prevention of separation. The cover layer has a higher rigidity when the step is disposed near a vertex of the electrode and the cover layer is on the step. Thus, the effect achieved by the cover layer near a vertex of the electrode is more reliably exerted.

Here, an example electrode arrangement on the surface of the electronic component body is described, with reference to FIG. 1 again.

The electronic component of the present disclosure may include multiple electrodes on the surface of the electronic component body. The multiple electrodes may include an outermost peripheral electrode most peripherally disposed on the surface of the electronic component body and an inner electrode inward of the outermost peripheral electrode. The outermost peripheral electrode may include a step, and the cover layer may be on the step.

The electrode with the cover layer thereon may include a step at its edge most peripherally disposed on the surface of the electronic component body, and the cover layer may be on the step.

The electronic component may include multiple electrodes on the surface of the electronic component body, at least one of the multiple electrodes may include a step at its edge facing adjacent electrode, and the cover layer may be on the step.

In FIG. 1, the electronic component body 10 includes nine electrodes on the surface. Among these nine electrodes, the four corner electrodes 20*a* and the four edge electrodes 20*b*, which are the outermost peripheral electrodes most peripherally disposed on the surface of the electronic component body 10, include the steps 24, and the cover layer 30 is on each step 24. The inner electrode 20*c* includes no steps.

The outermost peripheral electrodes most peripherally disposed on the surface of the electronic component body are each an electrode susceptible to separation due to drop impact or handling impact during production. Thus, prevention of electrode separation by providing the cover layer on such sites is highly required. The effect achieved by the cover layer on each step is further exerted when one or more outermost peripheral electrodes include the steps at the outer peripheries thereof and the cover layer is on each step.

In FIG. 1, the corner electrodes 20*a* and the edge electrodes 20*b*, which are the outermost peripheral electrodes most peripherally disposed on the surface of the electronic component body 10, each include the steps 24 at edges 25 most peripherally disposed on the surface of the electronic component body 10, and the cover layer 30 is on each step 24.

In FIG. 1, the corner electrodes 20*a* and the edge electrodes 20*b* each having a square top-view shape include the steps 24 near vertices at both ends of the edge 25 most peripherally disposed on the surface of the electronic component body 10, among the four vertices of the square. This is also one of the cases where the outermost peripheral electrode includes the step at its edge most peripherally disposed on the surface of the electronic component body, among all the edges thereof.

The outermost peripheral electrode may include the steps not only near the vertices at both ends of its edge most peripherally disposed on the surface of the electronic component body among all the vertices thereof, but also along the entirety of an edge most peripherally disposed on the surface of the electronic component body among all the edges thereof.

Among all the edges of the outermost peripheral electrode, an edge most peripherally disposed on the surface of the electronic component body is susceptible to electrode separation due to drop impact or handling impact during production. Thus, prevention of electrode separation by providing the cover layer on such a site is particularly highly required. The effect achieved by the cover layer on each step is further exerted when one or more outermost peripheral electrodes include the steps at their edges most peripherally disposed on the surface of the electronic component body and the cover layer is on each step.

Portions near vertices at both ends of an edge most peripherally disposed on the surface of the electronic component body, among all the vertices of the outermost peripheral electrode, are the sites most susceptible to electrode separation due to drop impact or handling impact during production. Thus, the steps may be disposed at these sites, and the cover layer may be disposed on each step.

In FIG. 1, the corner electrode 20*a* and the edge electrode 20*b* are adjacent to each other. Each electrode includes the step 24 at its edge 26 facing its adjacent electrode, and the cover layer 30 is on the step.

In FIG. 1, the steps 24 are each disposed near a vertex at one end of each edge 26 facing adjacent electrode. This is also one of the cases where the electrodes each include the step at its edge facing adjacent electrode.

The edges each facing adjacent electrode are susceptible to drop impact or handling impact during production. Thus, prevention of electrode separation by providing the cover layer on such sites is particularly highly required. The effect achieved by the cover layer on each step is further exerted when one or more electrodes include the steps at their edges facing adjacent electrodes and the cover layer is on each step. In addition, the steps and the cover layer on such sites can secure a gap between the electrode and its adjacent electrode.

The following describes examples of embodiments of the structures of the electrodes on the surface of the electronic component other than those shown in FIG. 1.

Figure 9:
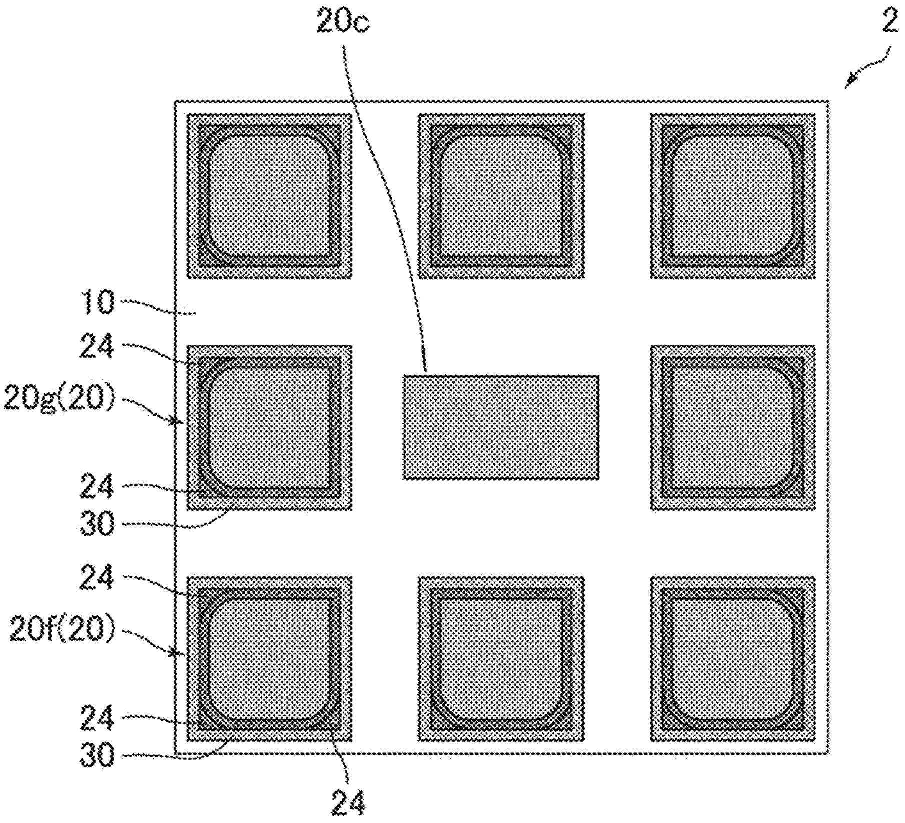
FIG. 9 is a schematic plan view of another example electronic component of the present disclosure.

FIG. 9 is a schematic plan view of another example electronic component of the present disclosure.

An electronic component 2 shown in FIG. 9 includes corner electrodes 20*f*, edge electrodes 20*g*, and the inner electrode 20*c* on the surface of the electronic component body 10.

The step 24 and the cover layer 30 on the corner electrodes 20*f* and the edge electrodes 20*g* are formed on different portions, as compared to the electronic component 1 shown in FIG. 1. The difference is described below.

Figure 10:
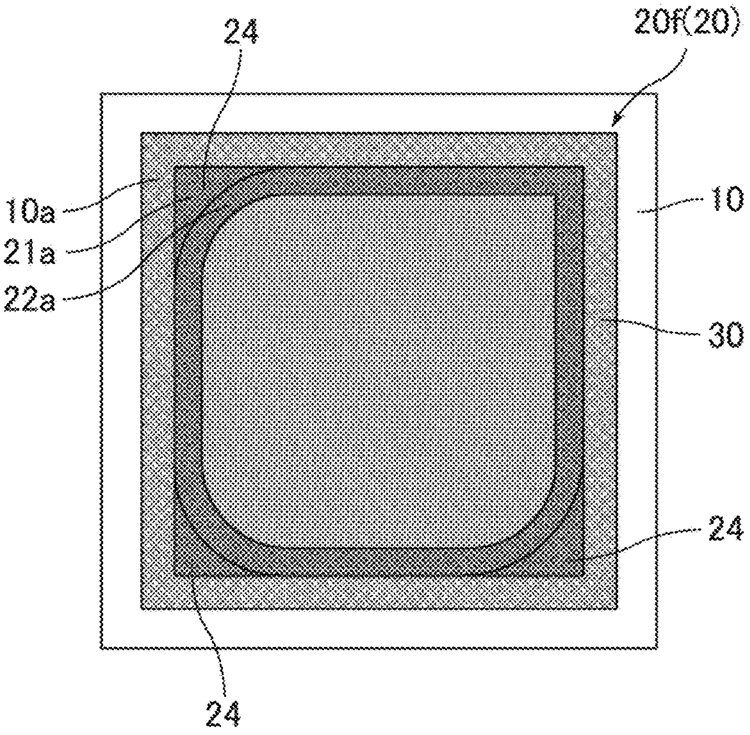
FIG. 10 is a schematic plan view of an example corner electrode and an example cover layer on the electronic component shown in FIG. 9.

FIG. 10 is a schematic plan view of an example corner electrode and an example cover layer on the electronic component shown in FIG. 9. FIG. 10 shows the corner electrode at a lower left vertex in FIG. 9 as an example.

The corner electrode 20*f* shown in FIG. 10 has a substantially square top-view shape. The steps 24 are near three vertices (near upper left, lower left, and lower right vertices) of the square.

The cover layer 30 is formed on a region including four edges of the corner electrode 20*f* having a square top-view shape and the three steps 24.

As shown in FIG. 9, the steps 24 of the corner electrode 20*f* having a square top-view shape are disposed near vertices at both ends of edges most peripherally disposed on the surface of the electronic component body 10, among the four vertices of the square. There is no step near an upper right vertex of the corner electrode 20*f* having a square top-view shape. The upper right vertex is not an end of an edge most peripherally disposed on the surface of the electronic component body 10.

Figure 11:
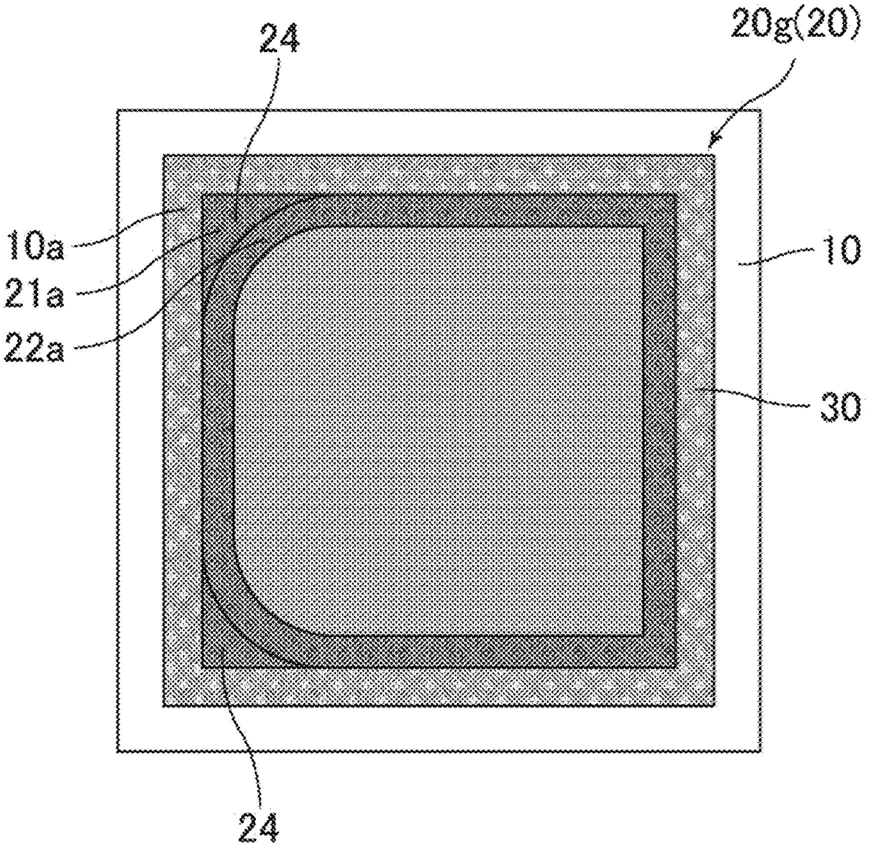
FIG. 11 is a schematic plan view of an example edge electrode and an example cover layer on the electronic component shown in FIG. 9.

FIG. 11 is a schematic plan view of an example edge electrode and an example cover layer on the electronic component shown in FIG. 9.

FIG. 11 shows the edge electrode at the center on the left side of FIG. 9 as an example.

The edge electrode 20*g* shown in FIG. 11 has a substantially square top-view shape. The steps 24 are near two vertices (near upper left and lower left vertices) of the square.

The cover layer 30 is formed on a region including four edges of the edge electrode 20*g* having a square top-view shape and the two steps 24.

As shown in FIG. 9, the steps 24 of the edge electrode 20*g* having a square top-view shape are disposed near vertices at both ends of an edge most peripherally disposed on the surface of the electronic component body 10, among the four vertices of the square. There are no steps near upper right and lower right vertices of the edge electrode 20*g* having a square top-view shape. The upper right and lower right vertices are not ends of an edge most peripherally disposed on the surface of the electronic component body 10.

In the electronic component 2 shown in FIG. 9, the corner electrodes 20*f* and the edge electrodes 20*g* each having a square top-view shape on the surface of the electronic component body each include the steps near vertices at both ends of an edge most peripherally disposed on the surface of the electronic component body 10, among the four vertices of the square. No step is disposed near a vertex that is not an end of an edge most peripherally disposed on the surface of the electronic component body 10.

Portions near vertices at both ends of an edge most peripherally disposed on the surface of the electronic component body, among all the vertices of the outermost peripheral electrode, are particularly susceptible to drop impact or handling impact during production. Thus, prevention of electrode separation by providing the cover layer on such sites is particularly highly required. The effect achieved by the cover layer on each step is further exerted when one or more outermost peripheral electrode include the steps at their edges most peripherally disposed on the surface of the electronic component body and the cover layer is on each step.

Among the four vertices of each electrode having a square top-view shape, a portion near a vertex that is not an end of an edge most peripherally disposed on the surface of the electronic component body is not so susceptible to drop impact or handling impact during production, so that the step is not much required at such a site. Thus, there is no step at such a site.

Subsequently, an example method of producing the electronic component of the present disclosure is described with reference to a case of producing a multilayer ceramic electronic component as an example.

First, ceramic green sheets to be converted into ceramic layers are provided. The ceramic green sheets can be formed, for example, by doctor blading a ceramic slurry on a carrier film.

A slurry containing the above-described low temperature co-fired ceramic (LTCC) material, a binder, and a plasticizer can be used as the ceramic slurry.

Internal conductor films and via conductors are formed in the ceramic green sheets using a conductive paste.

Electrodes are formed using a conductive paste on a ceramic green sheet to be placed on a surface of the electronic component after multiple ceramic green sheets are stacked. The electrodes can be formed, for example, by forming a pattern by a technique such as screen printing or photolithography using the conductive paste.

During formation of the electrodes, the lower electrode and the upper electrode are overlaid on each other with different patterns so as to provide steps at least part of the periphery of a predetermined electrode.

The materials of the conductive paste are as described above.

At each step at the periphery of the electrode, a ceramic paste for cover layer is printed by a method such as screen printing on a ceramic green sheet to be placed on the surface of the electronic component after multiple ceramic green sheets are stacked, in such a manner that the ceramic paste covers from a surface of the upper electrode to a surface of a portion with no electrodes on the ceramic green sheet.

The ceramic paste for cover layer may be printed on the ceramic green sheet as described above or may be printed during a period until firing starts after completion of stacking (described later).

The cover layer may be formed by a coating method such as dispensing the ceramic paste instead of printing.

Alternatively, the cover layer may be formed by producing a sheet with a pattern of the cover layer thereon and transferring the sheet to a surface of a ceramic green sheet to be placed on the surface of the electronic component after multiple ceramic green sheets are stacked.

The multiple ceramic green sheets are stacked in a predetermined order and compression bonded, whereby the stacking is executed to produce a green electronic component.

Figure 12:
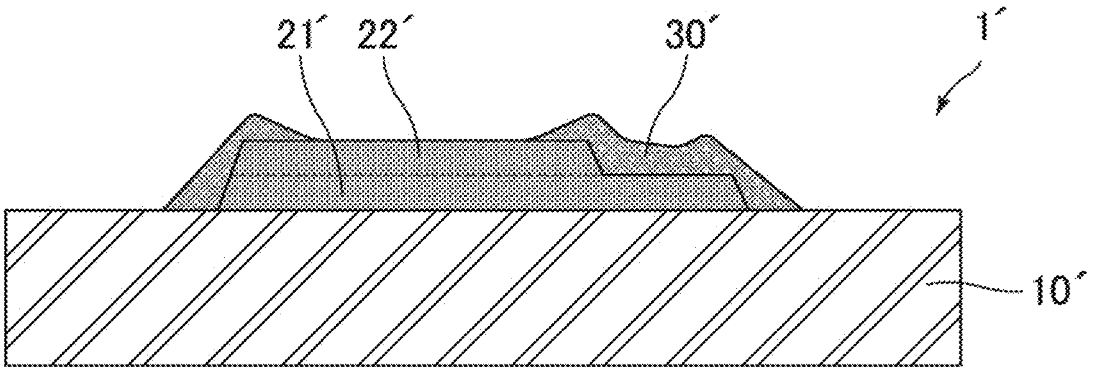
FIG. 12 is a schematic cross-sectional view of an example green electronic component.

FIG. 12 is a schematic cross-sectional view of an example green electronic component.

FIG. 12 shows a green electronic component 1' including a green lower electrode 21' and a green upper electrode 22' which are pattern-formed on a stack 10' of green ceramic green sheets, and a green cover layer 30' covering from a surface of the green upper electrode 22' to a surface of a portion with no electrodes on the stack 10'.

FIG. 12 shows a state before compression bonding and firing.

Subsequently, the green electronic component is fired, whereby an electronic component is obtained. The firing sinters the ceramic material of the ceramic green sheets, the internal conductor films, the via conductors, the lower and upper electrodes on the surface of the electronic component, and the cover layer.

The electronic component obtained by the firing has a cross section as shown in FIG. 3.

The electrodes and the cover layer on the surface of the electronic component are pushed into the stack by compression bonding, and materials shrink. As a result, the surface of the electronic component becomes flat as shown in FIG. 3.

Plating is performed as needed, whereby a conductive film is formed on the upper electrode. FIG. 5 shows an example embodiment including a conductive film.

Thus, the electronic component of the present disclosure is obtained.

1, 2 electronic component
1' green electronic component
10 electronic component body
10*a* portion with no electrodes on surface of electronic component body
10' stack of green ceramic green sheets
20, 20*d*, 20*e* electrode
20*a*, 20*f* corner electrode (outermost peripheral electrode)
20*b*, 20*g* edge electrode (outermost peripheral electrode)
20*c* inner electrode
21 lower electrode
21*a* surface of lower electrode
21' green lower electrode
22 upper electrode
22*a* surface of upper electrode
22' green upper electrode
23 boundary between lower electrode and upper electrode
24 step
25 edge most peripherally disposed on surface of electronic component body
26 edge facing adjacent electrode
30 cover layer
30' green cover layer
40 conductive film

The invention claimed is:

1. An electronic component comprising:
an electronic component body;
at least one electrode on a surface of the electronic component body; and
a cover layer having insulating properties on at least a part of a periphery of the electrode and extending across a boundary between the periphery of the electrode and the surface of the electronic component body,
wherein the surface of the electronic component body includes a ceramic layer containing a first low temperature co-fired ceramic material, and the cover layer contains a second low temperature co-fired ceramic material,
the electrode includes, on the at least part of the periphery, a lower electrode closer to the surface of the electronic component body and an upper electrode on the lower electrode, the upper electrode comprising a top surface and a bottom surface,
the lower electrode is in direct contact with an entirety of the bottom surface of the upper electrode,
the cover layer is not disposed between the lower electrode and the upper electrode,
the lower electrode extends more outward than the upper electrode to create a step at the at least part of the periphery of the electrode, and
at the step at the periphery of the electrode, the cover layer extends from the top surface of the upper electrode to a portion with no electrodes on the surface of the electronic component body.

2. The electronic component according to claim 1,
wherein the at least one electrode includes multiple electrodes on the surface of the electronic component body,
the multiple electrodes include an outermost peripheral electrode most peripherally disposed on the surface of the electronic component body and an inner electrode inward of the outermost peripheral electrodes,
the outermost peripheral electrode includes the step, and
the cover layer is on the step.

3. The electronic component according to claim 2,
wherein the outermost peripheral electrode includes the step at its edge most peripherally disposed on the surface of the electronic component body, and
the cover layer is on the step.

4. The electronic component according to claim 1,
wherein the at least one electrode includes multiple electrodes on the surface of the electronic component body,
at least one of the multiple electrodes includes the step at its edge facing adjacent electrode of the multiple electrodes, and
the cover layer is on the step.

5. The electronic component according to claim 1, wherein the electronic component includes a conductive film on the upper electrode, and the conductive film is not covered with the cover layer.

6. The electronic component according to claim 1, wherein the at least one electrode with the cover layer thereon is laid in the electronic component body.

7. A method of producing an electronic component, comprising:

forming a lower electrode and an upper electrode on a ceramic green sheet such that the lower and upper electrodes are overlaid on each other with different patterns so as to provide a step at at least a part of a periphery of a predetermined electrode; and printing a ceramic paste on the step by screen printing such that the ceramic paste covers from a surface of the upper electrode to a surface of a portion with no electrodes on the ceramic green sheet.

8. The electronic component according to claim 2, wherein the at least one electrode includes multiple electrodes on the surface of the electronic component body, at least one of the multiple electrodes includes the step at its edge facing adjacent electrode of the multiple electrodes, and the cover layer is on the step.

9. The electronic component according to claim 3, wherein the at least one electrode includes multiple electrodes on the surface of the electronic component body, at least one of the multiple electrodes includes the step at its edge facing adjacent electrode of the multiple electrodes, and the cover layer is on the step.

10. The electronic component according to claim 2, wherein the electronic component includes a conductive film on the upper electrode, and the conductive film is not covered with the cover layer.

11. The electronic component according to claim 3, wherein the electronic component includes a conductive film on the upper electrode, and the conductive film is not covered with the cover layer.

12. The electronic component according to claim 4, wherein the electronic component includes a conductive film on the upper electrode, and the conductive film is not covered with the cover layer.

13. The electronic component according to claim 2, wherein the at least one electrode with the cover layer thereon is laid in the electronic component body.

14. The electronic component according to claim 3, wherein the at least one electrode with the cover layer thereon is laid in the electronic component body.

15. The electronic component according to claim 4, wherein the at least one electrode with the cover layer thereon is laid in the electronic component body.

16. The electronic component according to claim 5, wherein the at least one electrode with the cover layer thereon is laid in the electronic component body.

17. The electronic component according to claim 1, wherein both the first low temperature co-fired ceramic material and the second low temperature co-fired ceramic material include a same low temperature co-fired ceramic material.

* * * * *